United States Patent [19]
Chen et al.

[11] Patent Number: 6,101,129
[45] Date of Patent: Aug. 8, 2000

[54] FAST CHIP ERASE MODE FOR NON-VOLATILE MEMORY

[75] Inventors: Johnny Chen, Cupertino; Tiao-Hua Kuo, San Jose; Nancy Leong, Sunnyvale, all of Calif.

[73] Assignee: Advanced Micro Devices, Inc., Sunnyvale, Calif.

[21] Appl. No.: 09/291,984

[22] Filed: Apr. 14, 1999

[51] Int. Cl.$^7$ .................................................. G11C 16/04
[52] U.S. Cl. .............................. 365/185.29; 365/185.14; 365/185.26
[58] Field of Search .................. 365/185.29, 185.26, 365/185.01, 185.14

[56] References Cited

U.S. PATENT DOCUMENTS

5,378,643  1/1995  Ajika et al. ................................ 437/43
5,646,885  7/1997  Matsuo et al. ...................... 365/185.05

*Primary Examiner*—David Nelms
*Assistant Examiner*—Thong Le
*Attorney, Agent, or Firm*—Fliesler, Dubb, Meyer & Lovejoy

[57] ABSTRACT

A method for fast chip erase of memory cells in a non-volatile memory array comprises the steps of providing an acceleration voltage greater than the internal pump voltage supplied by a conventional internal voltage supply pump, providing an erase write command, and performing a fast erase operation on the memory cells, comprising the step of coupling the acceleration voltage to the sources of the memory cells in a plurality of sectors simultaneously. In an embodiment, a fast preprogramming operation is performed on the memory cells prior to the step of performing the fast erase operation in the fast chip erase mode. In a further embodiment, a fast weak programming (APDE) operation is performed on the memory cells subsequent to the step of performing the fast erase operation in the fast chip erase mode. In an additional embodiment, the step of performing the fast erase operation further comprises the steps of detecting the acceleration voltage, generating an acceleration voltage indicator signal in response to the detection of the acceleration voltage, and generating a fast chip erase write command in response to the acceleration voltage indicator signal and the erase write command.

62 Claims, 7 Drawing Sheets

FIG. 1

| | Z3(0) | Z3(1) | Z3(2) | Z3(3) |
|---|---|---|---|---|
| Z4(17) | SS1 | SS3 | SS5 | SS7 |
| Z4(16) | SS0 | SS2 | SS4 | SS6 |
| Z4(15) | SA60 | SA61 | SA62 | SA63 |
| Z4(14) | SA56 | SA57 | SA58 | SA59 |
| Z4(13) | SA52 | SA53 | SA54 | SA55 |
| Z4(12) | SA48 | SA49 | SA50 | SA51 |
| Z4(11) | SA44 | SA45 | SA46 | SA47 |
| Z4(10) | SA40 | SA41 | SA42 | SA43 |
| Z4(9) | SA36 | SA37 | SA38 | SA39 |
| Z4(8) | SA32 | SA33 | SA34 | SA35 |
| Z4(7) | SA28 | SA29 | SA30 | SA31 |
| Z4(6) | SA24 | SA25 | SA26 | SA27 |
| Z4(5) | SA20 | SA21 | SA22 | SA23 |
| Z4(4) | SA16 | SA17 | SA18 | SA19 |
| Z4(3) | SA12 | SA13 | SA14 | SA15 |
| Z4(2) | SA8 | SA9 | SA10 | SA11 |
| Z4(1) | SA4 | SA5 | SA6 | SA7 |
| Z4(0) | SA0 | SA1 | SA2 | SA3 |

FAST CHIP ERASE MODE FOR NON-VOLATILE MEMORY

TECHNICAL FIELD

The present invention relates to a non-volatile memory, and more particularly, to a method for fast chip erase of memory cells in the non-volatile memory.

BACKGROUND ART

Non-volatile memory devices have been developed by the semiconductor integrated circuit industry for various applications such as computers and digital communications. A conventional non-volatile or flash memory device includes a plurality of memory cells typically organized in a plurality of memory sectors. Within each memory sector, the memory cells are arranged in an array comprising a plurality of rows and a plurality of columns. A plurality of word lines are coupled to the respective rows of the memory cells, and a plurality of bit lines are coupled to the respective columns of the memory cells. Each of the memory cells may be a typical binary dual-gate NOR device, for example, which comprises a source, a drain and a gate. Each memory cell is capable of storing one bit. During the operation of a conventional non-volatile memory, a memory cell is either programmed or erased by supplying a pump voltage to either the drain or the source of the memory cell, depending upon whether the non-volatile memory is in a conventional embedded program mode or in a conventional embedded erase mode.

When the memory cells are in a conventional embedded program mode, it is usual that more than one bit and sometimes all of the bits need be programmed on each of the word lines. For example, if a memory sector comprises a 16-bit words, then a row of sixteen memory cells are disposed on each word line, and sixteen bit lines are connected to the sixteen memory cells, respectively.

In a conventional embedded program mode, a pump current is supplied to the drain of each memory cell to be programmed. A conventional internal power supply pump is typically capable of supplying only a limited amount of total pump current to some but not all of the bit lines simultaneously. For example, in conventional programming of flash memory cells comprising typical dual-gate NOR devices, wherein each NOR gate stores either bit "0" upon being programmed or bit "1" upon being "erased", a pump current typically on the order of about 0.5 mA need be provided to the drain of each memory cell to be programmed with bit "0" through the respective bit line.

However, a conventional internal pump with a typical voltage supply of 3 V or lower is typically limited in its capability to supplying pump currents to the drains of no more than five of the memory cells at a time. In order to program a 16-bit word, for example, sixteen columns of memory cells on sixteen bit lines are grouped into four sets, each set comprising four columns. When the memory cells are programmed in a conventional embedded program mode, the conventional internal pump is connected to provide pump currents to program the columns of memory cells on the respective bit lines one set at a time. For example, a typical 16-bit word with bits numbered 0–15 may be grouped into four sets of bits numbered 0–3, 4–7, 8–11 and 12–15. When any set of four bits are to be programmed with up to four zeroes, this arrangement ensures that a sufficient pump current is supplied to the drain of each of the memory cells through the respective bit line. When the memory cells are in a conventional embedded chip erase mode, the conventional internal pump has similar limitations in that it is capable of erasing the memory cells by supplying a source voltage to the sources of memory cells in only one set of columns at a time.

Because the conventional internal pump has a limited current supply and is typically capable of programming or erasing the memory cells only one set at a time, it takes a plurality of pulses generated by the internal pump to be supplied to different sets of memory cells during the programming or erase of each word along each word line. Moreover, the power from the conventional internal power supply pump need be switched to different sets of bit lines during the programming or erase of each word.

Furthermore, the memory cells can be erased only one sector at a time in a conventional chip erase mode. Therefore, programming and erase of memory cells can be time consuming in the conventional embedded program and erase modes. Therefore, there is a need for a method of erasing the memory cells with a speed faster than that which is achieved by the conventional embedded chip erase mode.

DISCLOSURE OF THE INVENTION

The present invention satisfies this need. In accordance with the present invention, a method for fast chip erase of non-volatile memory cells generally comprises the steps of:

(a) providing an acceleration voltage greater than the internal pump voltage supplied by the conventional internal voltage supply pump, which is only capable of erasing a limited number of columns of memory cells at a time;

(b) providing an erase write command;

(c) disabling the internal voltage supply pump from providing the internal pump voltage to the memory cells; and (d) performing a fast erase operation on the memory cells, comprising the step of coupling the acceleration voltage to the sources of the memory cells in a plurality of sectors simultaneously.

In an embodiment in which the flash memory cells comprise typical dual-gate NOR devices, the source voltage for erasing the memory cells is typically on the order of about 5 V, and the acceleration voltage may be in the range of about 7 V to about 10 V. In an embodiment, the acceleration voltage is reduced to the source voltage by a regulator, for example, before it is applied to the sources of the memory cells to be erased in the fast chip erase mode according to the present invention. In a further embodiment, a gate voltage on the order of about −9 V is applied to each one of the word lines during the fast chip erase of typical dual-gate NOR flash memory cells. Each of the NOR flash memory cells stores bit "1" upon being erased.

In an embodiment, the step of performing the fast erase operation further comprises the steps of:

(i) detecting the acceleration voltage;

(ii) generating an acceleration voltage indicator signal in response to a determination by the step of detecting the acceleration voltage that the acceleration voltage is present; and (iii) generating a fast chip erase write command in response to the acceleration voltage indicator signal and the erase write command.

In an embodiment, the step of providing the erase write command comprises the steps of:

(i) performing a first write cycle, comprising the steps of performing a first address writing operation and a first data writing operation; and (ii) performing a second write cycle, comprising the steps of performing a second address writing operation and a second data writing operation.

In an embodiment, additional fast preprogramming and fast weak programming steps are applied to the memory cells before and after the fast erase operation to ensure that all of the memory cells in the flash memory array are cleanly erased in the fast chip erase mode. In this embodiment, the method for fast chip erase of memory cells according to the present invention further comprises the steps of:

performing a fast preprogramming operation prior to the step of performing the fast erase operation; and performing a fast weak programming (APDE) operation subsequent to the step of performing the fast erase operation.

In a further embodiment, the fast preprogramming operation in the fast chip erase mode according to the present invention may be performed as if the flash memory cells are in a fast programming mode, by applying a drain voltage supplied by the acceleration voltage source to the drains of the memory cells such that all of the memory cells in the array are "preprogrammed" with bit "0" before they are erased with bit "1" in the fast erase operation. The drain voltage may be generated by regulating the acceleration voltage and is applied to all of the bit lines at a time during the fast preprogramming operation.

In yet a further embodiment, the acceleration voltage is applied to the gates of the memory cells without regulation through the word lines during the fast preprogramming operation. Furthermore, the sources of the memory cells are grounded during the step of performing the fast preprogramming operation in the fast chip erase mode.

The fast weak programming (APDE) operation in the fast chip erase mode according to the present invention may be performed in a manner similar to the fast preprogramming operation, except that the gates of the memory cells are grounded.

Advantageously, the method according to the present invention allows the memory cells in a non-volatile memory array to be erased at a speed significantly faster than that which is achieved by a conventional embedded chip erase mode. Furthermore, the method according to the present invention is capable of improving the speed of preprogramming and APDE operations in the fast chip erase mode. A further advantage of the method according to the present invention is that a plurality of sectors of memory cells can be erased simultaneously, thereby improving the erase speed over the conventional chip erase mode which allows the memory cells to be erased only one sector at a time. Yet a further advantage of the method according to the present invention is that only one acceleration voltage source is required for the fast chip erase of all of the memory cells in a non-volatile memory array.

BRIEF DESCRIPTION OF THE DRAWINGS

The present invention will be described with respect to particular embodiments thereof, and references will be made to the drawings in which.

MODES FOR CARRYING OUT THE INVENTION

Figure 1:
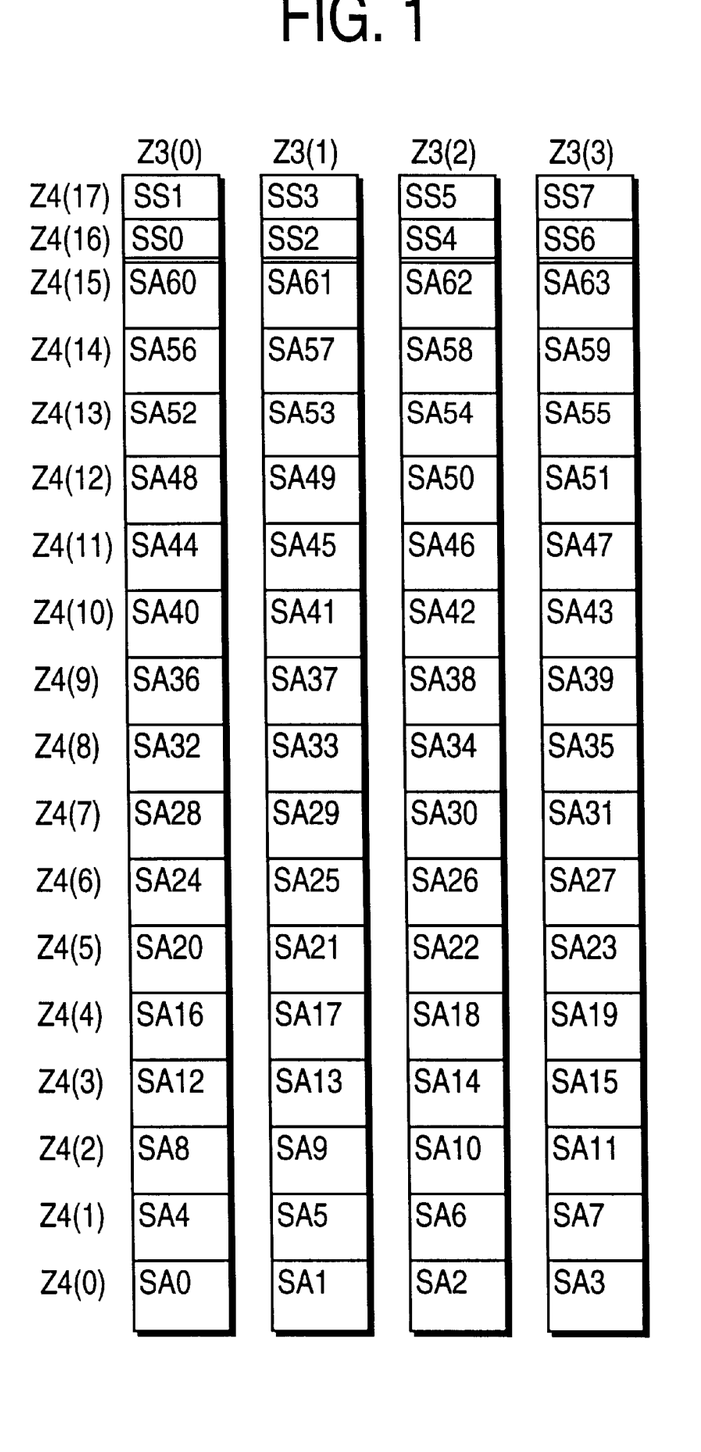
FIG. 1 is a simplified diagram showing a typical arrangement of memory sectors in a typical non-volatile memory device.

FIG. 1 shows a simplified diagram of an example of a non-volatile memory device which includes a plurality of memory sectors indicated by blocks SA0, SA1, SA2, . . . SA63 and SS0, SS1, SS2, . . . SS7. The memory sectors SA0, SA1, SA2, . . . SA63 and SS0, SS1, SS2, . . . SS7 are arranged in a plurality of rows and columns, with each row containing four memory sectors. The rows of the memory sectors are numbered consecutively from Z4 (0) to Z4 (17), and the columns of the memory sectors are numbered consecutively from Z3(0) to Z3(3). Sectors labeled SA0, SA1, SA2, . . . SA63 may be used for data or code storage, whereas sectors labeled SS0, SS1, SS21 . . . SS7 are reserved for code storage. Each of the sectors comprises an array of memory cells arranged in a plurality of columns and rows. A plurality of word lines are coupled to the respective rows, and a plurality of bit lines are coupled to the respective columns of the memory cells. For example, if each of the sectors labeled SA0, SA1, SA2, . . . SA63 has 64 kilobytes of memory, each sector may include an array comprising 512 word lines and 1,024 bit lines.

As described in Background Art above, the individual bits within each word are grouped into a plurality of sets, for example, four sets each containing four bits in a 16-bit word. The bit lines are arranged in a plurality of corresponding sets to allow a conventional internal voltage supply or drain pump to provide the required pump currents for programming the memory cells on the bit lines one set at a time in a conventional embedded program mode, since the conventional internal voltage supply pump is typically incapable of providing the total pump current required for programming all sixteen bits of any particular word simultaneously. Furthermore, only one sector of memory cells can be erased at a time in a conventional embedded chip erase mode.

Figure 2:
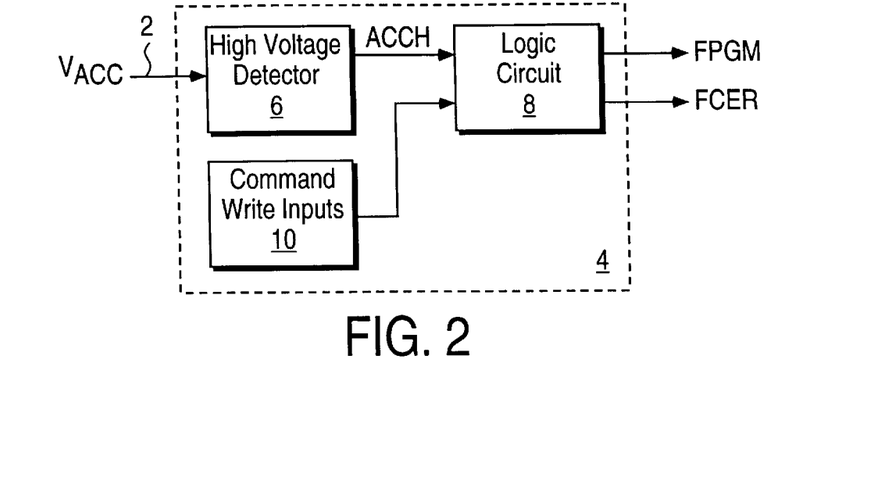
FIG. 2 shows a block diagram of an acceleration circuit capable of setting a flash memory in a fast chip erase mode according to the present invention.

FIG. 2 shows a block diagram of an acceleration circuit for fast programming and fast chip erase of the memory cells in accordance with the present invention. The acceleration circuit generally comprises an acceleration input 2 which is capable of providing an acceleration voltage $V_{ACC}$ to supply a programming current for programming the bit lines in all the sets at a time in a fast program mode. Furthermore, the acceleration circuit comprises a triggering circuit 4, coupled to the acceleration input 2, capable of disabling the internal voltage supply pump and enabling the acceleration voltage $V_{ACC}$ to be supplied to the memory cells in all of the sets at a time in response to a presence of the acceleration voltage $V_{ACC}$ at the acceleration input 2. The acceleration voltage $V_{ACC}$ may be supplied from an acceleration pin, which serves as the acceleration input 2 and is capable of receiving the acceleration voltage $V_{ACC}$ from a source external to the integrated circuit chip for the non-volatile memory.

In the embodiment shown in FIG. 2, the triggering circuit 4 comprises a high voltage detector 6, coupled to the acceleration input 2 to receive the acceleration voltage $V_{ACC}$, which in an embodiment is in the range of about 7 V to about 10 V. The high voltage detector 6 generates an acceleration voltage indicator signal ACCH upon detecting the acceleration voltage $V_{ACC}$ at the acceleration input 2, and feeds the acceleration voltage indicator signal ACCH to a logic circuit 8.

The logic circuit 8, which has an input coupled to receive the acceleration voltage indicator signal ACCH from the high voltage detector 6, also has at least one command write input 10 to set the non-volatile memory array in a fast mode of operation. In an embodiment in which the non-volatile memory array is to be set in a fast program mode, the command write inputs 10 comprise a program command write input capable of receiving a program command. In an additional embodiment in which the non-volatile memory array is to be set in a fast chip erase mode, the command write inputs 10 further comprise an erase command write input capable of receiving an erase command.

The logic circuit 8 has an output which is capable of generating a fast program command FPGM to set the non-volatile memory array in a fast program mode in response to the presence of the acceleration voltage indicator signal ACCH generated by the high voltage detector 6 and the presence of the program command at the program command write input 10. In an additional embodiment, logic circuit 8 has a second output which is capable of generating a fast chip erase command FCER to set the non-volatile memory array in a fast chip erase mode. The logic circuit 8 generates the fast chip erase command FCER in response to the presence of the acceleration voltage indicator signal ACCH from the high voltage detector 6 and the presence of the erase command at the erase command write input 10.

Figure 3:
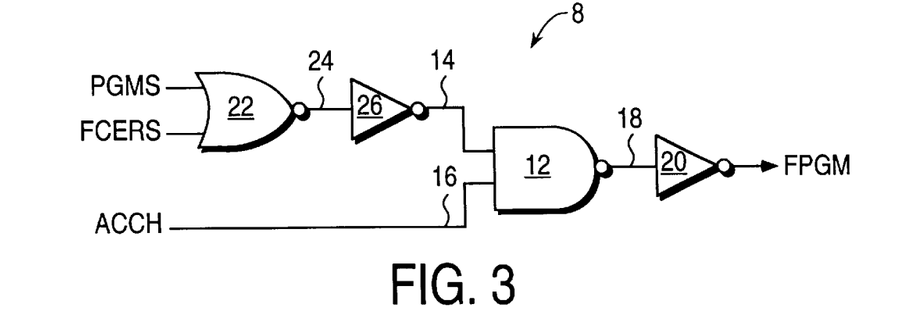
FIG. 3 shows an embodiment of a portion of the logic circuit in the block diagram of FIG. 2 for generating a fast program command FPGM.

FIG. 3 shows a logic diagram of an embodiment of a portion of the logic circuit 8 in the acceleration circuit of FIG. 2. In this embodiment, the logic circuit 8 comprises a NAND gate 12 having a first input 14 coupled to receive the program command PGMS, a second input 16 coupled to receive the acceleration voltage indicator signal ACCH, and an output 18 coupled to an inverter 20, which in response generates the output fast program command FPGM. In this embodiment, the input program command PGMS may be a program command for setting the non-volatile memory array in either a conventional embedded program mode or a fast program mode. The NAND gate 12 in the logic circuit 8 requires that both the input program command PGMS and the acceleration voltage indicator signal ACCH be present in order to set the non-volatile memory array in a fast program mode.

When the fast chip erase mode according to the present invention is desired to be implemented for the non-volatile memory array, another input is provided to receive a fast chip erase command write signal FCERS. In an embodiment, a NOR gate 22 is provided in the logic circuit 8 with inputs coupled to receive the input program command PGMS and the fast chip erase command write signal FCERS. The NOR gate 22 has an output 24 which is coupled to the input of an inverter 26, the output of which is connected to the first input 14 of the NAND gate 12. When the non-volatile memory array is set in the fast chip erase mode according to the present invention, a fast preprogramming operation is initiated to "program" all of the memory cells with bit "0" before they are "erased" with bit "1". The initial fast preprogramming operation in the fast chip erase mode follows the same process steps as those performed on the memory cells during the fast programming operation in the fast program mode. Therefore, the presence of the fast chip erase command write signal FCERS and the acceleration voltage indicator signal ACCH would also trigger the logic circuit 8 to generate the fast program command FPGM.

Figure 4:
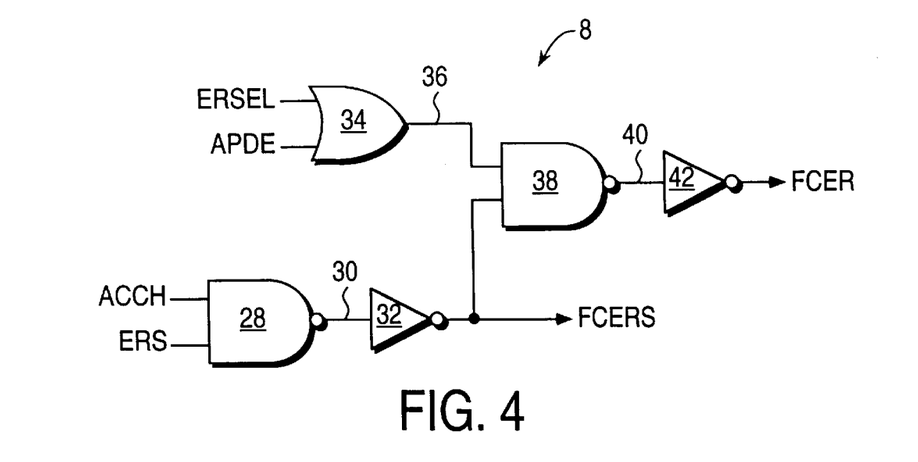
FIG. 4 shows an embodiment of a portion of the logic circuit in the block diagram of FIG. 2 for generating a fast chip erase command FCER.

FIG. 4 is a logic diagram showing an embodiment of another portion of the logic circuit 8 in the acceleration circuit of FIG. 2. In this embodiment, a NAND gate 28 has a first input coupled to receive the acceleration voltage indicator signal ACCH, a second input coupled to receive an erase command ERS, and an output 30. An inverter 32, which is coupled to the output 30 of the NAND gate 28, outputs the fast chip erase command write signal FCERS in response to the presence of both the acceleration voltage indicator signal ACCH and the erase command ERS at the inputs of the NAND gate 28. In this embodiment, the input erase command ERS may be a command for setting the non-volatile memory array in either a conventional embedded chip erase mode or the fast chip erase mode according to the present invention. The fast chip erase command write signal FCERS is generated only if both the input erase command ERS and the acceleration voltage indicator signal ACCH are present. In a further embodiment, the fast chip erase command write signal FCERS is fed to one of the inputs of the NOR gate 22 shown in FIG. 3 to initiate the fast preprogramming operation as a first step in the fast chip erase mode according to the present invention.

When the non-volatile memory array is in the fast chip erase mode, a fast preprogramming operation is performed on the memory cells prior to the step of performing a fast erase operation, which is in turn followed by the step of performing a fast weak programming operation, also called a fast APDE operation. The process steps performed on the memory cells in the fast chip erase mode according to the present invention will be discussed in further detail below.

Referring to FIG. 4, an OR gate 34 is provided in the logic circuit 8 with a first input coupled to receive an erase select command ERSEL, second input coupled to receive a weak program command APDE, and an output 36. Furthermore, a NAND gate 38 is provided in the logic circuit 8, with a first input coupled to the output 36 of the OR gate 34, a second input coupled to receive the fast chip erase command write signal FCERS from the inverter 32, and an output 40 which is coupled to an inverter 42. The inverter 42 generates the fast chip erase command FCER in response to the presence of the fast chip erase command write signal FCERS and either the erase select command ERSEL or the weak program command APDE. In this embodiment, the fast chip erase command FCER is generated during the steps of performing fast erase and fast weak programming (APDE) operations subsequent to the step of performing the initial fast preprogramming operation when the memory cells are in the fast chip erase mode.

Figure 5A:
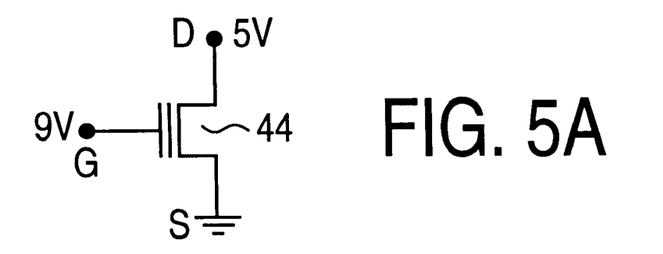
FIG. 5A shows typical voltages applied to the drain, source and gate of a memory cell comprising a typical binary dual-gate NOR device when it is preprogrammed.
Figure 5B:
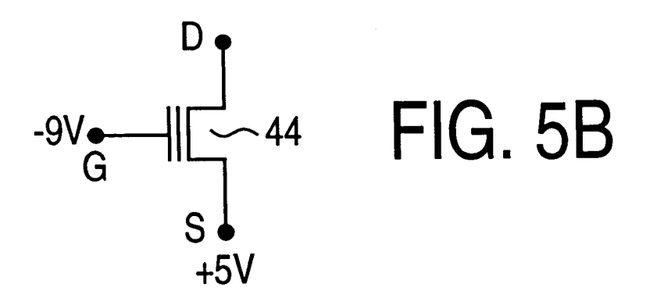
FIG. 5B shows typical voltages applied to the drain, source and gate of the memory cell as shown in FIG. 5A when it is erased.
Figure 5C:
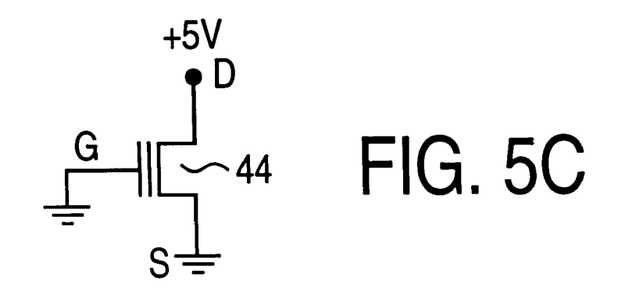
FIG. 5C shows typical voltages applied to the drain, source and gate of the memory cell as shown in FIG. 5A when it is weakly programmed.

FIGS. 5A–5C illustrate the voltages applied to the drain, source and gate of a typical flash memory cell, which in this embodiment comprises a typical NOR device. FIG. 5A shows the voltages applied to the memory cell when it is being preprogrammed with bit "0" in the fast chip erase mode according to the present invention. The drain D of the memory cell 44 is applied a voltage on the order of about 5 V, the gate G is applied a voltage on the order of about 9 V, and the source S of the memory cell 44 is grounded.

FIG. 5B shows the voltages applied to the terminals of the memory cell 44 when it is being erased in the fast chip erase mode according to the present invention. The gate G of the memory cell 44 is applied a voltage on the order of about −9 V, and the source S of the memory cell 44 is applied a voltage on the order of about 5 V. The drain D of the memory cell 44 is a floating terminal during erasure. The memory cell 44 stores bit "1" upon being erased.

FIG. 5C shows the voltages applied to the terminals of the memory cell 44 when a weak programming (APDE) operation is performed on the memory cell 44 in the fast chip erase mode according to the present invention. During the APDE operation, both the gate G and the source S of the memory cell 44 are grounded while the drain D of the memory cell 44 is applied a positive voltage on the order of about 5 V.

Figure 6:
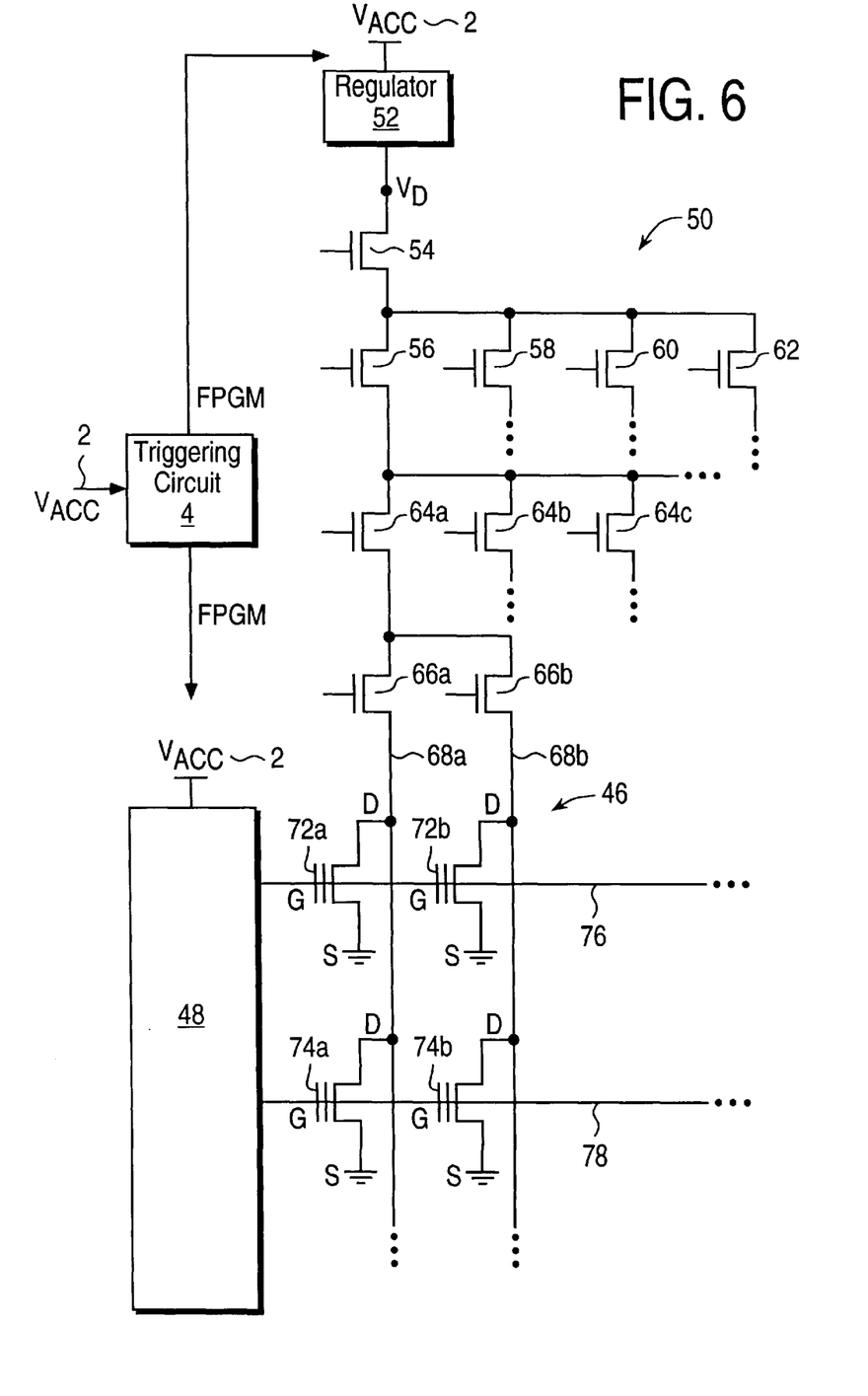
FIG. 6 is a circuit diagram showing an application of the acceleration circuit of FIG. 2 to fast programming of memory cells during the step of performing a fast preprogramming operation in the fast chip erase mode according to the present invention.

FIG. 6 shows a circuit diagram of a memory sector including a memory array 46, a row decoder, also called an X-decoder 48, a column decoder, also called a Y-decoder 50, a triggering circuit 4, and an acceleration input 2 when a fast preprogramming operation is performed on the memory array 46 in the fast chip erase mode. In this embodiment, a fast program command signal FPGM generated by the triggering circuit 4 triggers the acceleration input 2 to supply power to generate the drain voltage $V_D$. In an embodiment in which the acceleration voltage $V_{ACC}$ is in the range of about 7 V to about 10 V, a regulator 52 is coupled to the acceleration input 2 to reduce the acceleration voltage $V_{ACC}$ to a desired drain voltage $V_D$, which in an embodiment is on the order of about 5 V for conventional flash memory cells comprising dual-gate NOR devices.

In the example shown in FIG. 6, a fast programming switch 54 comprises a conventional MOS transistor which is capable of supplying the drain voltage $V_D$ to the Y-decoder 50. In an embodiment, the Y-decoder 50 comprises multiple rows of conventional MOS transistors to selectively distribute the current produced by the drain voltage $V_D$ to the bit lines in the memory array. In the example illustrated in FIG. 6, the Y-decoder 50 comprises four first-level MOS transistors 56, 58, 60 and 62 coupled to the fast programming transistor 54. The current from each of the first-level transistors 56, 58, 60 and 62 is routed to a plurality of second-level MOS transistors. For example, the current flowing from the first-level transistor 56 is routed to second-level transistors 64a, 64b, 64c, . . . Furthermore, each of the second level transistors 64a, 64b, 64c, . . . is coupled to two third-level MOS transistors, each of which is connected to a respective bit line in the memory array 46 to supply the programming current to the drain of a memory cell on the respective bit line. For example, the second-level transistor 64a is coupled to two third-level transistors 66a and 66b which distribute programming currents to bit lines 68a and 68b, respectively.

The number of rows of transistors and the number of transistors within each row in the Y-decoder 50 depends upon the number of bit lines in each sector of memory array. If the regulator 52 is coupled to supply programming currents to 64 bit lines, for example, four first-level MOS transistors are coupled to the fast programming transistor 54, eight second-level MOS transistors are coupled to each of the first-level transistors, and two third-level MOS transistors are coupled to each of the second-level transistors in the Y-decoder 50.

During the fast preprogramming operation, the MOS transistors in the Y-decoder 50 may be selectively turned on or off to selectively program the bit lines, but all of the bit lines selected to be programmed in the array 46 are supplied with a single pulse of drain voltage $V_D$ when each word is programmed in the fast program mode. The column decoding scheme as shown in FIG. 6 is merely an illustrative example of means for supplying the current produced by the acceleration voltage $V_{ACC}$ to each of the bit lines in a flash memory array. However, the present invention is not limited to the column decoding scheme as shown in FIG. 6. Other column decoding schemes can also be used to distribute the current from the acceleration input 2 to the bit lines in the memory array within the scope of the present invention.

In a further embodiment, the acceleration voltage $V_{ACC}$ may be supplied to the word lines as a gate voltage for the memory cells during the fast preprogramming operation in the fast chip erase mode. FIG. 6 shows a portion of the memory array 46 with four memory cells 72a, 72b, 74a and 74b each comprising a conventional dual-gate NOR device. The gates of the memory cells 72a and 72b are connected to the X-decoder 48 through word line 76, while the gates of the memory cells 74a and 74b are connected to the X-decoder 48 through word line 78. Although the gate turn-on voltage for a typical dual-gate NOR device is typically on the order of about 9 V, a voltage on the order of about 7 V to 10 V is sufficient to turn on the NOR devices on the word line selected to be programmed. The gates of the NOR devices in each row are connected to a respective word line. The current flowing through the word line selected to be programmed is negligibly small because the word line is used only to supply a gate voltage to the memory cells in the respective row. Therefore, the power supply for the X-decoder 48 is usually not critical to the limitations of current supply by the power source.

In an embodiment, the acceleration voltage $V_{ACC}$ is supplied from the acceleration input 2 to the X-decoder 48 without regulation. When the memory array 46 is in the fast program mode, the word lines 76, 78, . . . in the memory array 46 may be turned on successively one at a time to program the memory cells on each word line. For example, when the acceleration voltage $V_{ACC}$ is supplied to the word line 76, the NOR devices 72a and 72b are turned on. When the drain voltage $V_D$, which is generated by the regulator 52 by reducing the acceleration voltage $V_{ACC}$, provides the programming current through the fast programming switch 54 and the Y-decoder 50 to the drain of the memory cell 72a, for example, memory cell 72a is preprogrammed with bit "0".

After all of the memory cells along the word line 76 are preprogrammed, the unregulated acceleration voltage $V_{ACC}$ is supplied to the next word line 78 by the X-decoder 48 to turn on the memory cells along the word line 78. A single pulse of drain voltage $V_D$ is then capable of programming all of the memory cells including memory cells 74a and 74b along the word line 78 with bit "0". During the fast preprogramming operation in the fast chip erase mode, the sources of the memory cells are grounded.

Figure 7:
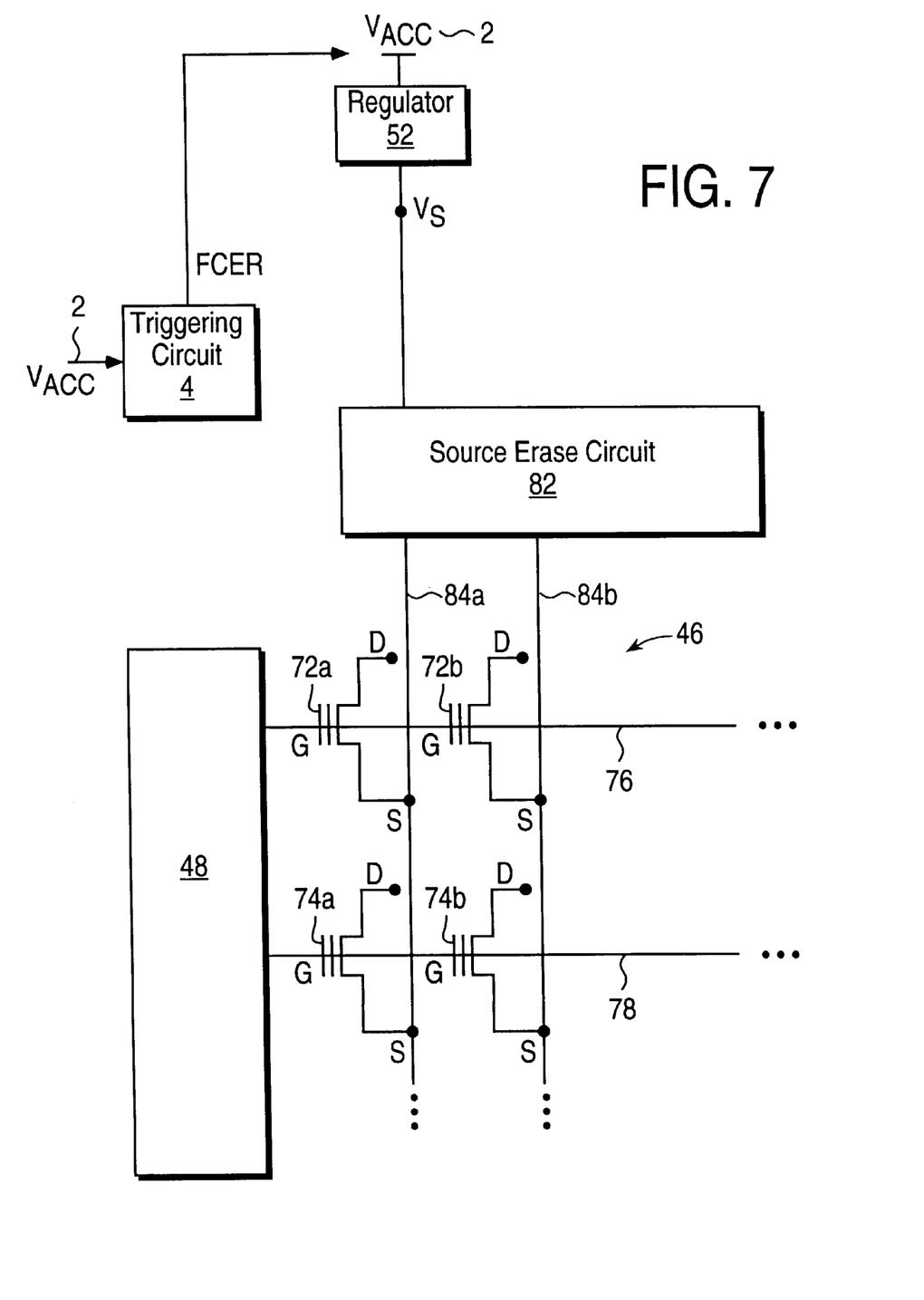
FIG. 7 is a circuit diagram showing the acceleration circuit of FIG. 2 supplying a source voltage to the sources of the memory cells during the step of performing a fast erase operation in the fast chip erase mode according to the present invention.

FIG. 7 shows a circuit diagram of an embodiment of the memory array 46 during a fast erase operation in the fast chip erase mode in accordance with the present invention. In this embodiment, the regulator 52 is coupled to the acceleration input 2 to reduce the acceleration voltage $V_{ACC}$, which is in the range of about 7 V to about 10 V in an embodiment, to a source voltage $V_S$, which is typically on the order of about 5 V to erase the memory cells with bit "1".

As shown in FIG. 7, the regulated voltage $V_S$ is supplied to the sources of the memory cells including memory cells 72a, 72b, 74a and 74b in the memory array 46 through a source erase circuit 82, which in an embodiment may be a conventional source erase circuit known to a person skilled in the art to distribute the regulated voltage $V_S$ to the sources of the memory cells 72a, 72b, 74a, 74b, ... The voltage $V_S$ is supplied to the sources of the memory cells without passing through the Y-decoder 50 and the bit lines 68a, 68b, ... shown in FIG. 6. Referring to FIG. 7, the voltage $V_S$ is supplied to the memory cells 72a, 74a and 72b, 74b through source lines 84a and 84b, respectively. During the step of performing the fast erase operation on the memory cells in the fast chip erase mode, a gate voltage, typically on the order of about −9 V, is supplied to the word lines to which the gates of the memory cells are connected. The drains of the memory cells 72a, 74a and 72b, 74b are floating during the step of performing the fast erase operation.

Since the source voltage $V_S$ during the fast erase operation in the fast chip erase mode is the same as the drain voltage $V_D$, which is typically on the order of about 5 V for typical dual-gate NOR memory cells during fast preprogramming and fast weak programming (APDE) operations, the same regulator 52 is implemented to reduce the acceleration voltage $V_{ACC}$, which is in the range of about 7 V to about 10 V in an embodiment, to a regulated voltage of about 5 V both as a drain voltage for fast preprogramming and fast APDE operations and as a source voltage for the fast erase operation. Furthermore, multiple sectors of memory cells can be erased simultaneously in the fast chip erase mode according to the present invention, thereby resulting in a faster erase speed than that which is achieved by the conventional embedded chip erase mode. For example, four memory sectors in any of the rows z4(0) ... z4(15) in FIG. 1 may be erased simultaneously in the fast chip erase mode according to the present invention.

Figure 8:
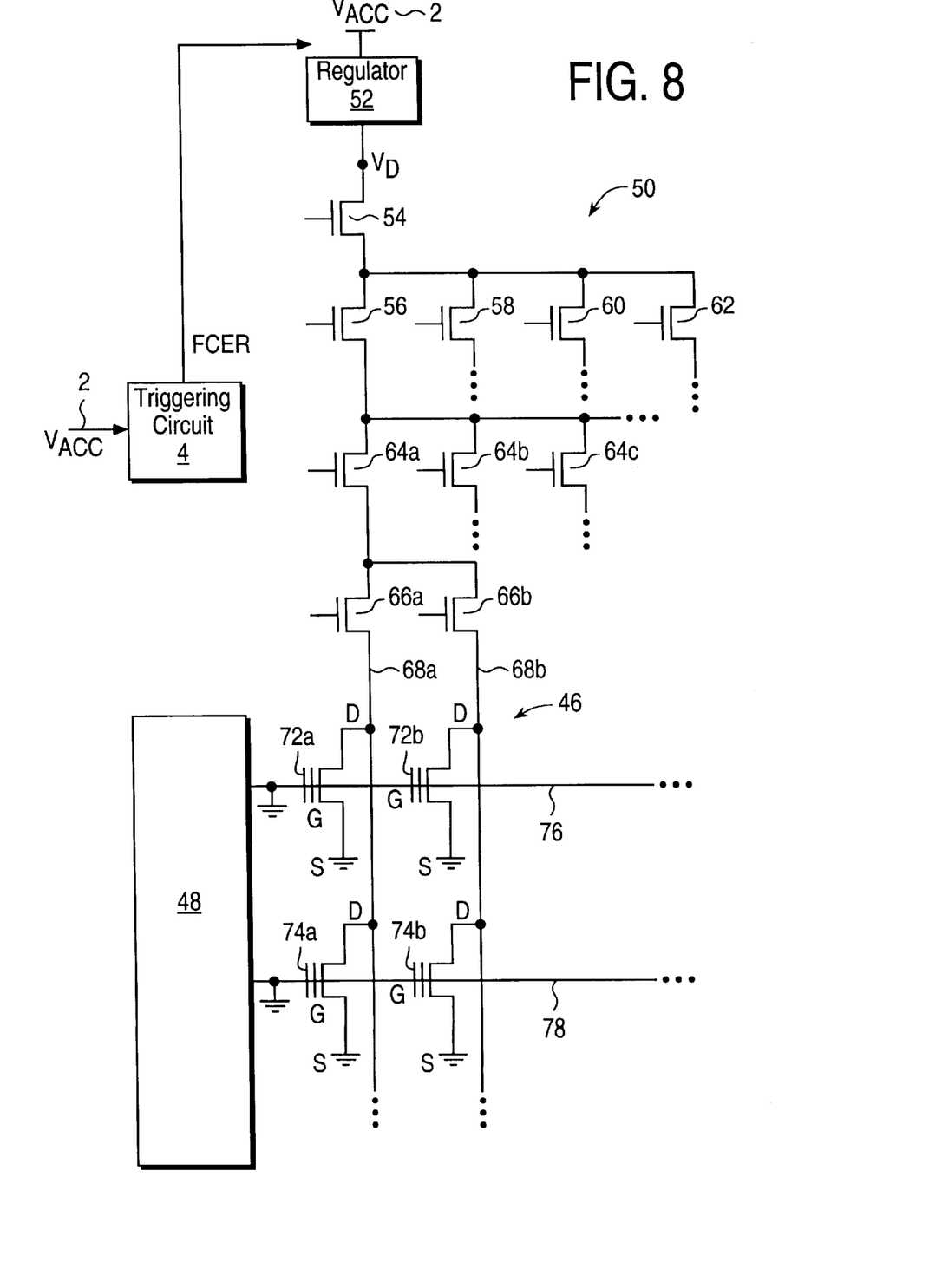
FIG. 8 is a circuit diagram showing the acceleration circuit of FIG. 2 supplying a drain voltage to the drains of the memory cells during the step of performing a fast weak programming (APDE) operation in the fast chip erase mode according to the present invention.

FIG. 8 shows a circuit diagram of the memory array 46 during the step of performing a fast weak programming (APDE) operation on the memory cells in the fast chip erase mode. FIG. 8 is similar to FIG. 6, which is described above for the fast preprogramming operation, except that the word lines 76 and 78 are grounded. The drains of the memory cells 72a, 72b, 74a and 74b are coupled to receive the regulated drain voltage $V_D$ while the sources and the gates of the memory cells are grounded. When the acceleration voltage $V_{ACC}$ is present at the acceleration input 2, the triggering circuit 4 triggers the supply of power from the acceleration input 2 to the drains of the memory cells in the array 46 through the regulator 52, the drain pump transistor 54, and the Y-decoder 50.

Figure 9:
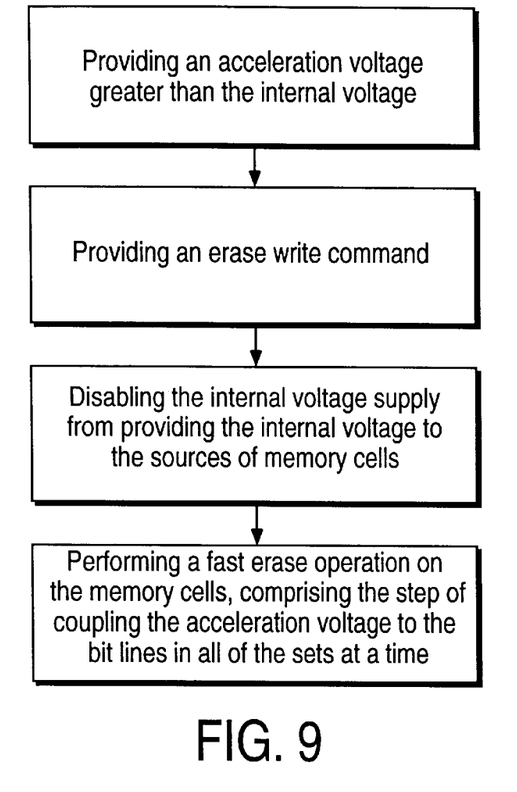
FIG. 9 is a flow chart roughly illustrating a method for fast chip erase of a non-volatile memory array according to the present invention.

The present invention provides a method for fast chip erase of the memory cells, roughly illustrated in the flowchart of FIG. 9, comprising the steps of:

(a) providing an acceleration voltage $V_{ACC}$ greater than the internal pump voltage supplied by the internal voltage supply pump;
(b) providing an erase write command ERS;
(c) disabling the internal voltage supply pump from providing a source voltage to the memory cells; and
(d) performing a fast erase operation on the memory cells, comprising the step of coupling the acceleration voltage $V_{ACC}$ to the sources of the memory in a plurality of sectors simultaneously.

In an embodiment, the step of performing the fast erase operation in the fast chip erase mode according to the present invention further comprises the steps of:

(i) detecting the acceleration voltage $V_{ACC}$;
(ii) generating an acceleration voltage indicator signal ACCH in response to the detection of the acceleration voltage $V_{ACC}$; and
(iii) generating a fast chip erase write command FCER in response to the acceleration voltage indicator signal ACCH and the erase write command ERS.

In the embodiment shown in FIG. 2, the acceleration voltage $V_{ACC}$ is detected by the high voltage detector 6. The logic circuit 8 is coupled to receive the acceleration voltage indicator signal ACCH and the command write inputs 10 including an input for receiving the erase write command ERS, and in response generates the fast chip erase write command FCER to trigger the fast erase operation. The external acceleration voltage $V_{ACC}$ is used as the source for generating the voltage $V_S$ which is supplied to the sources of the memory cells as shown in FIG. 7.

In a further embodiment, the step of providing the erase write command ERS comprises the steps of performing two write cyles each comprising an address writing operation and a data writing operation. An example of command definitions for performing the two write cycles in the step of providing the erase write command ERS to initiate the fast chip erase mode according to the present invention is listed in Table A below:

TABLE A

| Command Sequences | | Bus Writes Cycles Req'd | First Bus Write Cycle | | Second Bus Write Cycle | |
|---|---|---|---|---|---|---|
| | | | Address | Data | Address | Data |
| Fast Chip Erase | Word Byte | 2 | XX XX | 80H | XX XX | 10H |

In this example, only two write cycles are required in the step of providing the erase write command ERS to initiate the fast chip erase mode. The command definitions for the two bus write cycles are different for the fast program and fast chip erase modes. Of course, the command definitions for the fast chip erase mode may be different for different types of flash memory devices and may be specified differently by a person skilled in the art.

In the examples of command definitions for the fast chip erase mode listed in Table A above, it is noted that there is no difference in the command definitions between fast chip erase of a word and fast chip erase of a byte. In the embodiments shown in FIGS. 6–8 and described above, each word of memory on each word line comprises a plurality of bytes, each of which comprises eight bits. Since all of the memory cells along any given word line in the memory array 46 are coupled to receive power supplied from the single acceleration input 2 during fast preprogramming, fast erase and fast weak programming (APDE) operations, all of the bytes in any given word can be erased simultaneously in the fast chip erase mode according to the present invention, whereas in a conventional embedded chip erase mode, the memory bits in any given word can only be erased one set at a time, for example, one-half byte at a time due to the limitations on the power supply capability of the conventional internal voltage supply pump. Therefore, the command definitions for erasure of words and for erasure of bytes need not be different in the fast chip erase mode according to the present invention.

In an embodiment in which the memory cells to be erased in the fast chip erase mode according to the present invention comprise typical dual-gate NOR devices, the source voltage is typically on the order of about 5 V, the gate voltage is typically on the order of about −9 V, and the drains of the NOR devices are floating during the step of performing the fast erase operation. In an embodiment in which the acceleration voltage is in the range of 7 V to about 10 V, the step of coupling the acceleration voltage to the bit lines comprises the steps of reducing the acceleration voltage to a source voltage on the order of about 5 V and applying the source voltage to the sources of the memory cells. A typical dual-gate binary NOR device stores bit "1" upon being erased and bit "0" upon being programmed.

Figure 10:
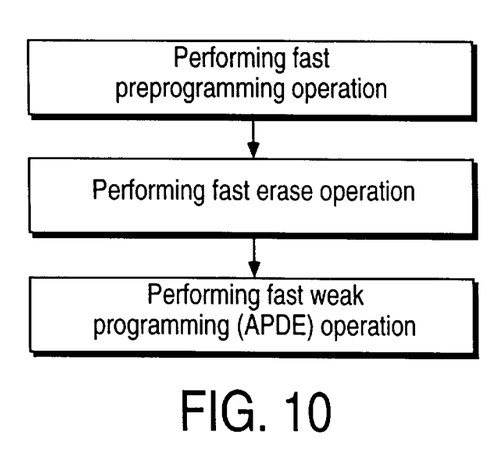
FIG. 10 is a flow chart roughly illustrating the steps of performing fast preprogramming, fast erase and fast APDE operations on the memory cells in the fast chip erase mode according to the present invention.

When a non-volatile memory array is in the fast chip erase mode according to the present invention, additional operational steps may be performed on the memory cells before and after the step of performing the fast erase operation to ensure that the memory cells in the array are cleanly erased. FIG. 10 shows an embodiment of a sequence of operational steps performed on the memory cells in the fast chip erase mode according to the present invention. In this embodiment, a fast preprogramming operation is performed on the memory cells prior to the step of performing the fast erase operation, and a fast weak programming (APDE) operation is performed on the memory cells subsequent to the step of performing the fast erase operation.

Before the memory cells are set in the fast chip erase mode, some of the memory cells may be storing bit "1" while others may be storing bit "0". There may be also some cells in an undefined memory state indicating neither "1" nor "0". To ensure the uniformity of erasure during the fast erase operation, a fast preprogramming operation is first performed on the memory cells to bring all of the memory cells in the array to the state of bit "0". In an embodiment, the fast preprogramming operation includes the step of coupling the acceleration voltage to provide programming currents through the bit lines to the drains of the memory cells.

In an embodiment in which each of the memory cells in the non-volatile memory array comprises typical dual-gate NOR devices, the drain voltage is typically on the order of about 5 V, the gate voltage is in the range of about 7 V to about 10 V, and the sources of the memory cells are grounded when the memory cells are preprogrammed. In an embodiment in which the acceleration voltage supplied from an external source is in the range of about 7 V to about 10 V, the step of coupling the acceleration voltage to provide the programming currents comprises the steps of reducing the acceleration voltage to a programming voltage on the order of about 5 V and applying the programming voltage to the drains of the memory cells on all of the bit lines selected to be preprogrammed.

Furthermore, the acceleration voltage, which in an embodiment is in the range of 7 V to 10 V, may be supplied to any one of the word lines selected to be preprogrammed without regulation. For example, the X-decoder 48 as shown in FIG. 6 may be coupled to supply the acceleration voltage $V_{ACC}$ to the word lines one at a time to preprogram the memory bits within each word. A single pulse of drain voltage $V_D$ is supplied by the Y-decoder 50 to all of the memory cells to be preprogrammed on each word line during the fast preprogramming operation. In an embodiment, each of the memory cells stores bit "0" upon being programmed.

During the step of performing the fast preprogramming operation, the acceleration voltage $V_{ACC}$ need be present to provide the necessary current to all of the bit lines in the memory array. The high voltage detector 6 in FIG. 2 generates the acceleration voltage indicator signal ACCH in response to a presence of the acceleration voltage $V_{ACC}$. In the logic circuit as shown in FIGS. 3 and 4, the presence of both the acceleration voltage indicator signal ACCH and the erase write command ERS triggers the fast chip erase command write signal FCERS, which along with the acceleration voltage indicator signal ACCH triggers the output fast program command FPGM. The output fast program command FPGM triggers the step of performing the fast preprogramming operation in the fast chip erase mode in this embodiment.

After the step of performing the fast erase operation on the memory cells in the fast chip erase mode, a fast weak programming operation, also called a fast APDE operation, is performed on the memory cells. In the embodiment in which each memory cell comprises a dual-gate NOR device, a voltage typically on the order of about 5 V is applied to the drain of the memory cell while both the gate and the source are grounded. A difference between the fast preprogramming operation and the fast APDE operation is that during the fast APDE operation, the X-decoder 48 as shown in FIG. 8 grounds the word lines 76 and 78 at 0 V, whereas during the fast preprogramming operation, the X-decoder 48 applies a gate turn-on voltage, which in the embodiment described above is in the range of about 7 V to about 10 V and supplied from the acceleration input 2 without regulation, to the gates of the memory cells to be preprogrammed.

In a further embodiment, the step of performing the fast weak programming operation comprises the steps of providing a weak program write command APDE and coupling the acceleration voltage $V_{ACC}$ to provide programming currents to the drains of the memory cells through the bit lines. In an embodiment using the logic circuit as shown in FIGS. 3 and 4, an input weak program write command APDE, together with the erase write command ERS and the acceleration voltage indicator signal ACCH, triggers the logic circuit 8 to generate the fast chip erase command FCER.

Furthermore, during the step of performing the fast erase operation in the fast chip erase mode according to the present invention, an input erase select command ERSEL is provided to the logic circuit 8 as shown in FIG. 4 to trigger the fast chip erase command FCER. The output fast chip erase command FCER is thus generated during either the fast erase operation or the fast APDE operation in the fast chip erase mode. Furthermore, prior to the steps of performing the fast erase and fast APDE operations, the fast preprogramming operation in the fast chip erase mode is initiated by the acceleration voltage indicator signal ACCH and the erase write command ERS, which together trigger the logic circuit 8 to generate the fast program command FPGM.

An advantage of the method according to the present invention is that it allows for a significant increase in the speed of erasing the memory cells in a non-volatile memory array over the conventional embedded chip erase mode. A further advantage of the method according to the present invention is that it is capable of providing a significant speed increase in the preprogramming and weak programming (APDE) operations, thereby increasing the overall speed of completely erasing the memory cells in the fast chip erase mode. Furthermore, the acceleration voltage $V_{ACC}$ may be supplied by a conventional power source external to the flash memory through only one acceleration pin, without significant redesign of the packaging of the device.

INDUSTRIAL APPLICABILITY

The method for fast chip erase of non-volatile memory cells according to the present invention is applicable to a wide variety of non-volatile memories including flash memories. Although examples of its applications in a typical flash memory array comprising conventional dual-gate NOR devices were described above, the method according to the present invention is not limited to the fast chip erase of dual-gate NOR devices. Furthermore, the present invention is not limited to the voltages applied to the drains, sources and gates of NOR devices in the examples described above. The principles of the present invention are applicable to different types of flash memory devices with different voltage and current requirements for fast chip erase operations.

The invention has been described with respect to particular embodiments thereof, and numerous modifications can be made which are within the scope of the invention as set forth in the claims.

What is claimed is:

1. In a non-volatile memory comprising at least one array of memory cells arranged in a plurality of rows and a plurality of columns, a plurality of word lines coupled to the respective rows of the memory cells, a plurality of bit lines coupled to the respective columns of the memory cells, each of the memory cells comprising a source and a drain and capable of storing a respective bit, the columns of memory cells arranged in a plurality of sets, and an internal voltage supply pump capable of generating an internal pump voltage for erasing the memory cells in one set of columns at a time in an embedded chip erase mode, a method for fast chip erase of the memory cells comprising the steps of:

(a) providing an acceleration voltage greater than the internal pump voltage;
   (b) providing an erase write command;
   (c) performing a fast erase operation on the memory cells, comprising the step of coupling the acceleration voltage to the sources of the memory cells in a plurality of sectors simultaneously; and
   (d) performing a fast preprogramming operation on the memory cells prior to the step of performing the fast erase operation.

2. The method of claim 1, wherein the acceleration voltage is in the range of about 7 V to about 10 V.

3. The method of claim 1, wherein the step of coupling the acceleration voltage to the sources of the memory cells comprises the steps of:

(A) reducing the acceleration voltage to a source voltage; and
   (B) applying the source voltage to the sources of the memory cells in all of the columns at a time.

4. The method of claim 3, wherein the acceleration voltage is in the range of about 7 V to about 10 V, and wherein the source voltage is on the order of about 5 V.

5. The method of claim 1, wherein the step of performing the fast erase operation further comprises the steps of:

(i) detecting the acceleration voltage;
   (ii) generating an acceleration voltage indicator signal in response to a determination by the step of detecting the acceleration voltage that the acceleration voltage is present; and
   (iii) generating a fast chip erase write command in response to the acceleration voltage indicator signal and the erase write command.

6. The method of claim 1, wherein the step of providing the erase write command comprises the steps of:

(i) performing a first write cycle, comprising the steps of performing a first address writing operation and a first data writing operation; and
   (ii) performing a second write cycle, comprising the steps of performing a second address writing operation and a second data writing operation.

7. The method of claim 1, wherein each of the memory cells stores bit "1" upon being erased.

8. The method of claim 1, wherein the step of performing the fast preprogramming operation comprises the step of coupling the acceleration voltage to provide a programming current to the drains of the memory cells in all of the columns at a time.

9. The method of claim 8, wherein the step of coupling the acceleration voltage to provide the programming current to the drains of the memory cells in the step of performing the fast preprogramming operation comprises the steps of:

(A) reducing the acceleration voltage to a drain voltage; and
   (B) applying the drain voltage to the drains of the memory cells in all of the columns at a time.

10. The method of claim 9, wherein the acceleration voltage is in the range of about 7 V to about 10 V, and wherein the drain voltage is on the order of about 5 V.

11. The method of claim 8, wherein the step of performing the fast preprogramming operation further comprises the step of grounding the sources of the memory cells.

12. The method of claim 8, wherein the step of performing the fast preprogramming operation further comprises the steps of:

(i) detecting the acceleration voltage; and
   (ii) generating an acceleration voltage indicator signal in response to a determination by the step of detecting the acceleration voltage that the acceleration voltage is present.

13. The method of claim 8, wherein the step of performing the fast preprogramming operation further comprises the step of supplying the acceleration voltage as a gate voltage to the word lines to be preprogrammed.

14. The method of claim 13, wherein the acceleration voltage is supplied to the word lines unregulated.

15. The method of claim 1, wherein each of the memory cells stores bit "0" upon being preprogrammed prior to the step of performing the fast erase operation.

16. The method of claim 1, further comprising the step of performing a fast weak programming operation on the memory cells subsequent to the step of performing the fast erase operation.

17. The method of claim 16, wherein the step of performing the fast weak programming operation comprises the steps of:

(i) providing a weak program write command; and
   (ii) coupling the acceleration voltage to provide a current to the drains of the memory cells on the bit lines in all of the sets at a time.

18. The method of claim 17, wherein the step of coupling the acceleration voltage to provide the current to the drains of the memory cells in the step of performing the fast weak programming operation comprises the steps of:

(A) reducing the acceleration voltage to a drain voltage; and (B) applying the drain voltage to the drains of the memory cells in all of the columns at a time.

19. The method of claim 18, wherein the acceleration voltage is in the range of about 7 V to about 10 V, and wherein the drain voltage is on the order of about 5 V.

20. The method of claim 17, wherein the step of performing the fast weak programming operation further comprises the step of grounding the word lines and the sources of the memory cells.

21. The method of claim 17, wherein the step of performing the fast weak programming operation further comprises the step of:

(iii) detecting the acceleration voltage; and (iv) generating an acceleration voltage indicator signal in response to a determination by the step of detecting the acceleration voltage that the acceleration voltage is present.

22. The method of claim 1, further comprising the step of disabling the internal voltage supply pump from providing the internal pump voltage.

23. In a non-volatile memory comprising at least one array of memory cells arranged in a plurality of rows and a plurality of columns, a plurality of word lines coupled to the respective rows of the memory cells, a plurality of bit lines coupled to the respective columns of the memory cells, each of the memory cells comprising a source and a drain and capable of storing a respective bit, the columns of memory cells arranged in a plurality of sets, and an internal voltage supply pump capable of generating an internal pump voltage for erasing the memory cells in one set of columns at a time in an embedded chip erase mode, a method for fast chip erase of the memory cells comprising the steps of:

(a) providing an acceleration voltage greater than the internal pump voltage;

(b) providing an erase write command; and (c) performing a fast erase operation on the memory cells, comprising the steps of:

(i) coupling the acceleration voltage to the sources of the memory cells in a plurality of sectors simultaneously; and (ii) providing a gate voltage on the order of about −9 V to the word lines.

24. In a non-volatile memory comprising at least one array of memory cells arranged in a plurality of rows and a plurality of columns, a plurality of word lines coupled to the respective rows of the memory cells, a plurality of bit lines coupled to the respective columns of the memory cells, each of the memory cells comprising a source and a drain and capable of storing a respective bit, the columns of memory cells arranged in a plurality of sets, and an internal voltage supply pump capable of generating an internal pump voltage for erasing the memory cells in one set of columns at a time in an embedded chip erase mode, a method for fast chip erase of the memory cells comprising the steps of:

(a) providing an acceleration voltage greater than the internal pump voltage;

(b) providing an erase write command;

(c) disabling the internal voltage supply pump from providing the internal pump voltage; and (d) performing a fast preprogramming operation on the memory cells;

(e) performing a fast erase operation on the memory cells in a plurality of sectors simultaneously subsequent to the step of performing the fast preprogramming operation, the step of performing the fast erase operation comprising the step of coupling the acceleration voltage to the sources of the memory cells; and (f) performing a fast weak programming operation on the memory cells subsequent to the step of performing the fast erase operation.

25. The method of claim 24, wherein the acceleration voltage is in the range of about 7 V to about 10 V.

26. The method of claim 24, wherein the step of coupling the acceleration voltage to the sources of the memory cells comprises the steps of:

(A) reducing the acceleration voltage to a source voltage; and (B) applying the source voltage to the sources of the memory cells in all of the columns at a time.

27. The method of claim 26, wherein the acceleration voltage is in the range of about 7 V to about 10 V, and wherein the source voltage is on the order of about 5 V.

28. The method of claim 26, wherein the step of performing the fast erase operation further comprises the step of providing a gate voltage on the order of about −9 V to the word lines.

29. The method of claim 24, wherein the step of performing the fast erase operation further comprises the steps of:

(i) detecting the acceleration voltage;

(ii) generating an acceleration voltage indicator signal in response to a determination by the step of detecting the acceleration voltage that the acceleration voltage is present; and (iii) generating a fast chip erase write command in response to the acceleration voltage indicator signal and the erase write command.

30. The method of claim 24, wherein the step of providing the erase write command comprises the steps of:

(i) performing a first write cycle, comprising the steps of performing a first address writing operation and a first data writing operation; and (ii) performing a second write cycle, comprising the steps of performing a second address writing operation and a second data writing operation.

31. The method of claim 24, wherein each of the memory cells stores bit "1" upon being erased.

32. The method of claim 24, wherein the step of performing the fast preprogramming operation comprises the step of coupling the acceleration voltage to provide a programming current to the drains of the memory cells in all of the columns at a time.

33. The method of claim 32, wherein the step of coupling the acceleration voltage to provide the programming current to the drains of the memory cells in the step of performing the fast preprogramming operation comprises the steps of:

(A) reducing the acceleration voltage to a drain voltage; and (B) applying the drain voltage to the drains of the memory cells in all of the columns at a time.

34. The method of claim 33, wherein the acceleration voltage is in the range of about 7 V to about 10 V, and wherein the drain voltage is on the order of about 5 V.

35. The method of claim 33, wherein the step of performing the fast preprogramming operation further comprises the step of grounding the sources of the memory cells.

36. The method of claim 33, wherein the step of performing the fast preprogramming operation further comprises the step of supplying the acceleration voltage as a gate voltage to the word lines to be preprogrammed.

37. The method of claim 32, wherein the step of performing the fast preprogramming operation further comprises the steps of:
(i) detecting the acceleration voltage; and
(ii) generating an acceleration voltage indicator signal in response to a determination by the step of detecting the acceleration voltage that the acceleration voltage is present.

38. The method of claim 37, wherein the acceleration voltage is supplied to the word lines unregulated.

39. The method of claim 24, wherein each of the memory cells stores bit "0" upon being preprogrammed prior to the step of performing the fast erase operation.

40. The method of claim 24, wherein the step of performing the fast weak programming operation comprises the steps of:
(i) providing a weak program write command; and
(ii) coupling the acceleration voltage to provide a current to the drains of the memory cells in all of the columns at a time.

41. The method of claim 40, wherein the step of coupling the acceleration voltage to provide the current to the drains of the memory cells in the step of performing the fast weak programming operation comprises the steps of:
(A) reducing the acceleration voltage to a drain voltage; and
(B) applying the drain voltage to the drains of the memory cells on the bit lines in all of the sets at a time.

42. The method of claim 41, wherein the acceleration voltage is in the range of about 7 V to about 10 V, and wherein the drain voltage is on the order of about 5 V.

43. The method of claim 40, wherein the step of performing the fast weak programming operation further comprises the step of grounding the word lines and the sources of the memory cells.

44. The method of claim 40, wherein the step of performing the fast weak programming operation further comprises the step of:
(iii) detecting the acceleration voltage; and
(iv) generating an acceleration voltage indicator signal in response to a determination by the step of detecting the acceleration voltage that the acceleration voltage is present.

45. In a non-volatile memory comprising at least one array of memory cells arranged in a plurality of rows and a plurality of columns, a plurality of word lines coupled to the respective rows of the memory cells, a plurality of bit lines coupled to the respective columns of the memory cells, each of the memory cells comprising a source and a drain and capable of storing a respective bit, the columns of memory cells arranged in a plurality of sets, and an internal voltage supply pump capable of generating an internal pump voltage for erasing the memory cells in one set of columns at a time in an embedded chip erase mode, a method for fast chip erase of the memory cells comprising the steps of:
(a) providing an acceleration voltage greater than the internal pump voltage;
(b) providing an erase write command; and
(c) performing a fast erase operation on the memory cells, comprising the steps of:
(i) detecting the acceleration voltage;
(ii) generating an acceleration voltage indicator signal in response to a determination by the step of detecting the acceleration voltage that the acceleration voltage is present;
(iii) generating a fast chip erase write command in response to the acceleration voltage indicator signal and the erase write command;
(iv) disabling the internal voltage supply pump from providing the internal pump voltage in response to the fast chip erase write command;
(v) reducing the acceleration voltage to a source voltage; and
(vi) applying the source voltage to the sources of the memory cells in a plurality of sectors simultaneously.

46. The method of claim 45, wherein the acceleration voltage is in the range of about 7 V to about 10 V, and wherein the source voltage is on the order of about 5 V.

47. The method of claim 45, wherein the step of performing the fast erase operation further comprises the step of providing a gate voltage on the order of about −9 V to the word lines.

48. The method of claim 45, wherein the step of providing the erase write command comprises the steps of:
(i) performing a first write cycle, comprising the steps of performing a first address writing operation and a first data writing operation; and
(ii) performing a second write cycle, comprising the steps of performing a second address writing operation and a second data writing operation.

49. The method of claim 45, wherein each of the memory cells stores bit "1" upon being erased.

50. The method of claim 45, further comprising the step of performing a fast preprogramming operation on the memory cells prior to the step of performing the fast erase operation.

51. The method of claim 50, wherein the step of performing the fast preprogramming operation comprises the steps of:
(i) detecting the acceleration voltage;
(ii) generating an acceleration voltage indicator signal in response to a determination by the step of detecting the acceleration voltage that the acceleration voltage is present; and
(iii) coupling the acceleration voltage to provide a programming current to the drains of the memory cells in all of the columns at a time in response to the acceleration voltage indicator signal and the erase write command.

52. The method of claim 51, wherein the step of coupling the acceleration voltage to provide the programming current to the drains of the memory cells in the step of performing the fast preprogramming operation comprises the steps of:
(A) reducing the acceleration voltage to a drain voltage; and
(B) applying the drain voltage to the drains of the memory cells in all of the columns at a time.

53. The method of claim 52, wherein the acceleration voltage is in the range of about 7 V to about 10 V, and wherein the drain voltage is on the order of about 5 V.

54. The method of claim 51, wherein the step of performing the fast preprogramming operation further comprises the step of grounding the sources of the memory cells.

55. The method of claim 52, wherein the step of performing the fast preprogramming operation further comprises the step of supplying the acceleration voltage as a gate voltage to the word lines to be preprogrammed.

56. The method of claim 55, wherein the acceleration voltage is supplied to the word lines unregulated.

57. The method of claim 50, wherein each of the memory cells stores bit "0" upon being preprogrammed prior to the step of performing the fast erase operation.

58. The method of claim 50, further comprising the step of performing a fast weak programming operation on the memory cells subsequent to the step of performing the fast erase operation.

59. The method of claim 58, wherein the step of performing the fast weak programming operation comprises the steps of:

(i) providing a weak program write command;

(ii) detecting the acceleration voltage;

(iii) generating an acceleration voltage indicator signal in response to a determination by the step of detecting the acceleration voltage that the acceleration voltage is present; and (iv) coupling the acceleration voltage to provide a current to the drains of the memory cells in all of the columns at a time in response to the acceleration voltage indicator signal and the weak program write command.

60. The method of claim 59, wherein the step of coupling the acceleration voltage to provide the current to the drains of the memory cells in the step of performing the fast weak programming operation comprises the steps of:

(A) reducing the acceleration voltage to a drain voltage; and (B) applying the drain voltage to the drains of the memory cells in all of the columns at a time.

61. The method of claim 60, wherein the acceleration voltage is in the range of about 7 V to about 10 V, and wherein the drain voltage is on the order of about 5 V.

62. The method of claim 59, wherein the step of performing the fast weak programming operation further comprises the step of grounding the word lines and the sources of the memory cells.

* * * * *